United States Patent
Erickson et al.

(10) Patent No.: US 8,592,921 B2
(45) Date of Patent: Nov. 26, 2013

(54) DEEP TRENCH EMBEDDED GATE TRANSISTOR

(75) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Ulmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 13/313,951

(22) Filed: Dec. 7, 2011

(65) Prior Publication Data

US 2013/0146992 A1    Jun. 13, 2013

(51) Int. Cl.
*H01L 29/02* (2006.01)

(52) U.S. Cl.
USPC ............................................. 257/402

(58) Field of Classification Search
CPC ............ H01L 29/7813; H01L 29/0696; H01L 29/1095; H01L 29/7811; H01L 29/41766; H01L 29/6659; H01L 21/823807
USPC ......... 257/320, 328, 329, 270, 271, 341, 331, 257/301, E29.133, E21.418, E29.02, 257/E29.066, E39.257, E21.419, E29.121, 257/E29.257, E29.26, 330, 332, 923, 257/E26.629, E29.027, E29.146, 257/E21.431–E21.435, E21.619–E21.62; 438/270, 157, 176, 195, 267, 283, 438/585–596, 135, 142
See application file for complete search history.

(56) References Cited

U.S. PATENT DOCUMENTS

| | | | |
|---|---|---|---|
| 4,890,144 A | 12/1989 | Teng et al. | |
| 5,065,273 A | 11/1991 | Rajeevakumar | |
| 7,023,041 B2 | 4/2006 | La Rosa et al. | |
| 7,154,332 B2 | 12/2006 | Tsuchi | |
| 7,491,608 B2 | 2/2009 | Forbes | |
| 7,494,873 B2 | 2/2009 | Forbes et al. | |
| 7,791,161 B2 | 9/2010 | Zhu et al. | |
| 7,964,930 B2 | 6/2011 | Goerlach et al. | |
| 7,983,070 B2 | 7/2011 | Forbes | |
| 2005/0112857 A1* | 5/2005 | Gluschenkov et al. | 438/585 |
| 2007/0007571 A1* | 1/2007 | Lindsay et al. | 257/306 |
| 2007/0170490 A1* | 7/2007 | Moon et al. | 257/315 |
| 2008/0305593 A1* | 12/2008 | Hsiao et al. | 438/261 |
| 2009/0218619 A1* | 9/2009 | Hebert et al. | 257/332 |
| 2010/0264484 A1 | 10/2010 | Masuoka et al. | |

* cited by examiner

*Primary Examiner* — Dao H Nguyen
*Assistant Examiner* — Tram H Nguyen
(74) *Attorney, Agent, or Firm* — Toler Law Group

(57) ABSTRACT

A semiconductor device includes a source extending into a surface of a substrate, a drain extending into the surface of the substrate, and an embedded gate in the substrate extending from the source to the drain.

20 Claims, 8 Drawing Sheets

DEEP TRENCH EMBEDDED GATE TRANSISTOR

I. FIELD OF THE DISCLOSURE

The present disclosure relates generally to semiconductor devices and particularly to transistors.

II. BACKGROUND

Power gating using field effect transistors (FET) is a method for controlling power to semiconductor device circuits. Design considerations for power gating FETs include current requirements, size, and performance during normal operation. Existing design and fabrication techniques may result in large power gating FETs that use considerable surface area of a semiconductor device.

III. SUMMARY

A transistor is disclosed having a source, a drain, and a gate that is embedded in a substrate and that extends between the source and the drain. The embedded gate may enable increased current capacity without increasing a size of the transistor at a surface of the substrate. The doping differential of the transistor source and drain to the substrate enables large depletion regions to form around the source and the drain that may reduce sub-threshold leakage current.

According to one embodiment, a method of fabricating a field effect transistor includes forming a source trench and a drain trench in a substrate. The substrate includes a first semiconductor material. A source depth of the source trench is approximately equal to a drain depth of the drain trench. The method further includes forming a source and a drain by depositing a second semiconductor material into the source trench and into the drain trench. The method further includes forming a gate trench in the substrate. The gate trench is formed to a gate depth and extends from the source to the drain. The method further includes forming a gate by depositing an insulating material into the gate trench and, after depositing the insulating material into the gate trench, depositing a first conductive material into the gate trench. The deposited insulating material is in contact with the second semiconductor material in the source trench and the drain trench.

According to a second embodiment, a semiconductor device includes a source extending into a surface of a substrate, a drain extending into the surface of the substrate, and a first embedded gate in the substrate that extends from the source to the drain.

According to a third embodiment, a semiconductor device includes a source having a source length along a surface of a substrate and a source depth into the substrate. The substrate includes a first semiconductor material and the source includes a second semiconductor material. The source depth is at least ten times greater than the source length. The semiconductor device further includes a drain having a drain length along the surface of the substrate and a drain depth into the substrate. The drain includes the second semiconductor material. The drain depth is at least ten times greater than the drain length. The semiconductor device further includes a gate having a gate length along the surface of the substrate and a gate depth into the substrate. The gate extends from the source to the drain and includes an insulating material and a conductive material.

IV. BRIEF DESCRIPTION OF THE DRAWINGS

Figure 4:
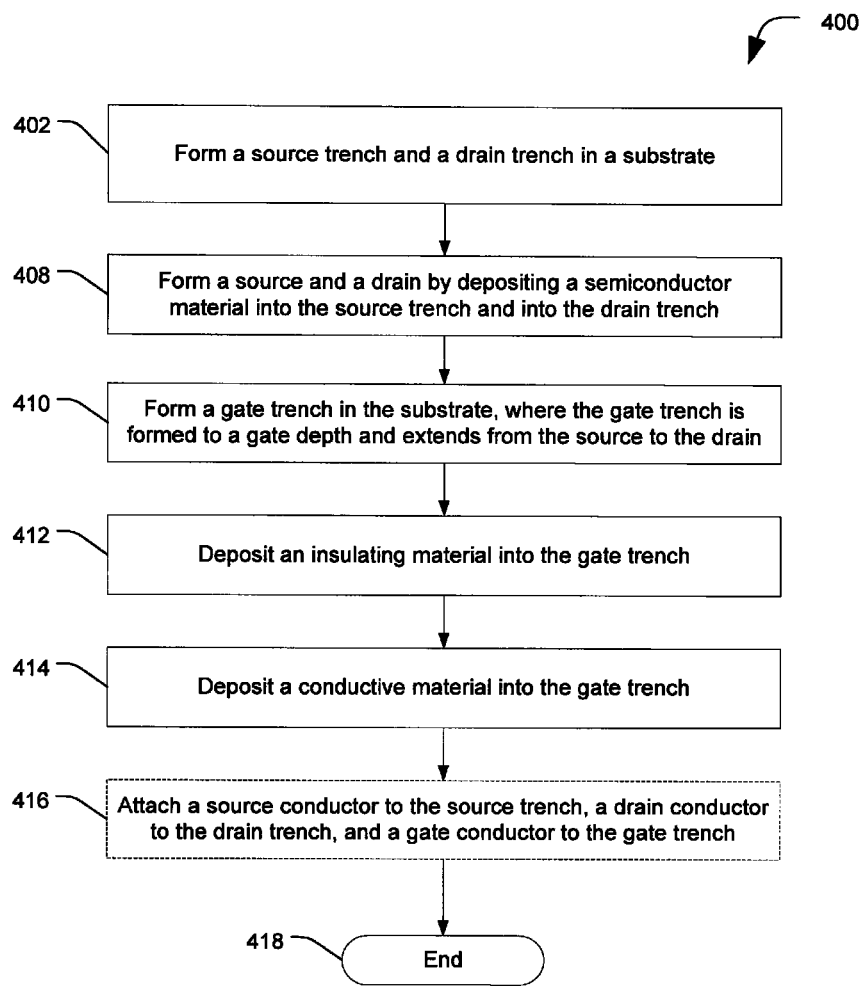
Figure 5:
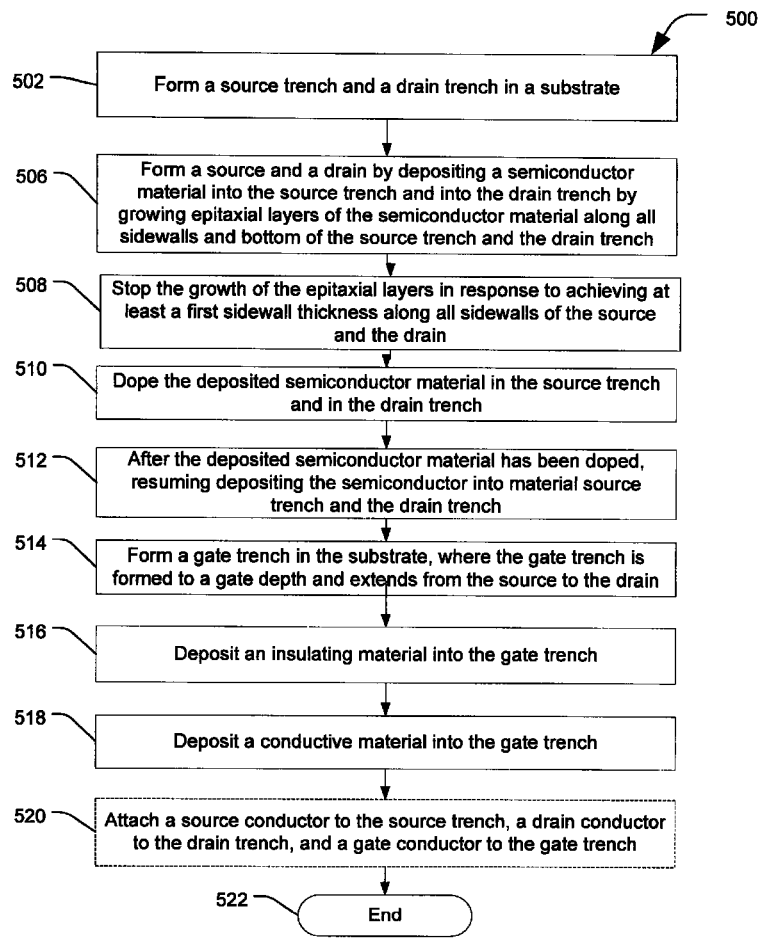
Figure 6:
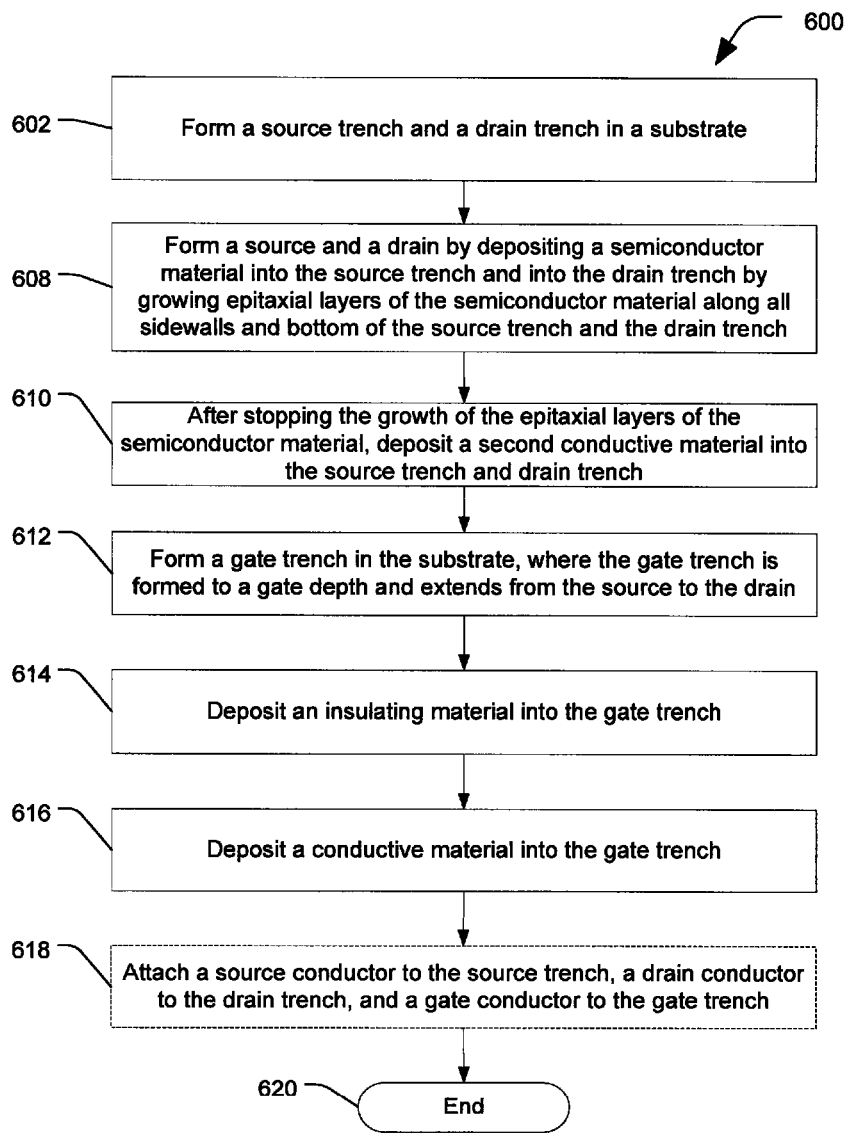
Figure 7:
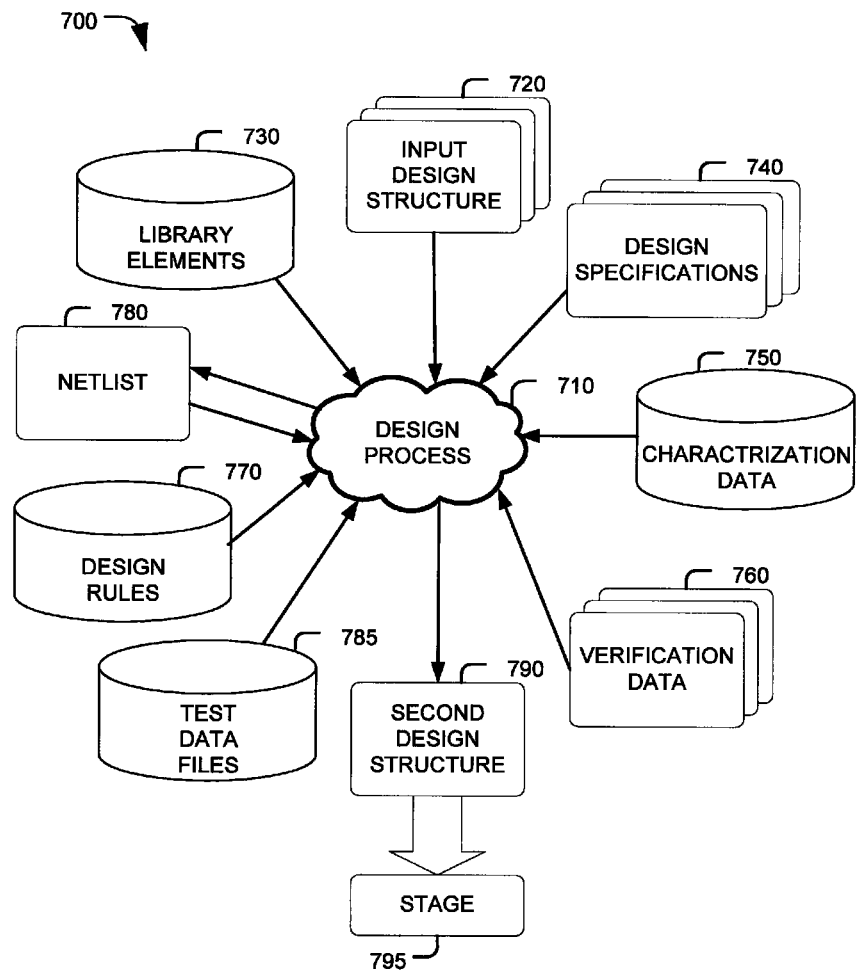

FIG. 3a-d are cross sectional side views illustrating stages of fabrication of a third particular embodiment of deep trench field effect transistor;

FIG. 4 is a flow chart of a first embodiment of a method of fabricating a deep trench transistor;

FIG. 5 is a flow chart of a second embodiment of a method of fabricating a deep trench transistor;

FIG. 6 is a flow chart of a third embodiment of a method of fabricating a deep trench transistor; and FIG. 7 is a flow diagram of a design process used in semiconductor design, manufacture, and/or test.

V. DETAILED DESCRIPTION

Figure 1A:
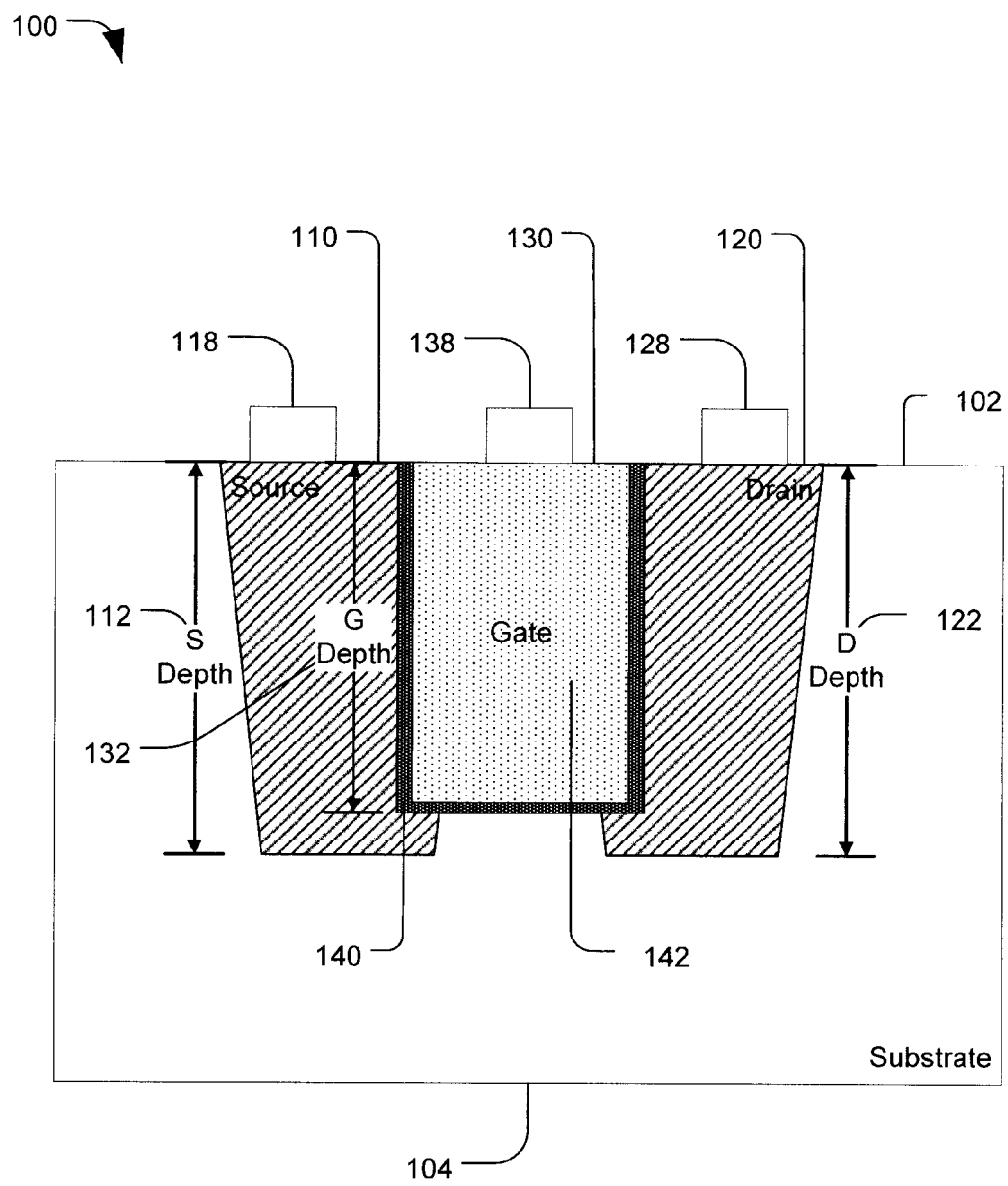
FIGS. 1a and 1b are a cross-sectional side view and a top plan view, respectively, of a particular embodiment of a deep trench field effect transistor.
Figure 1B:
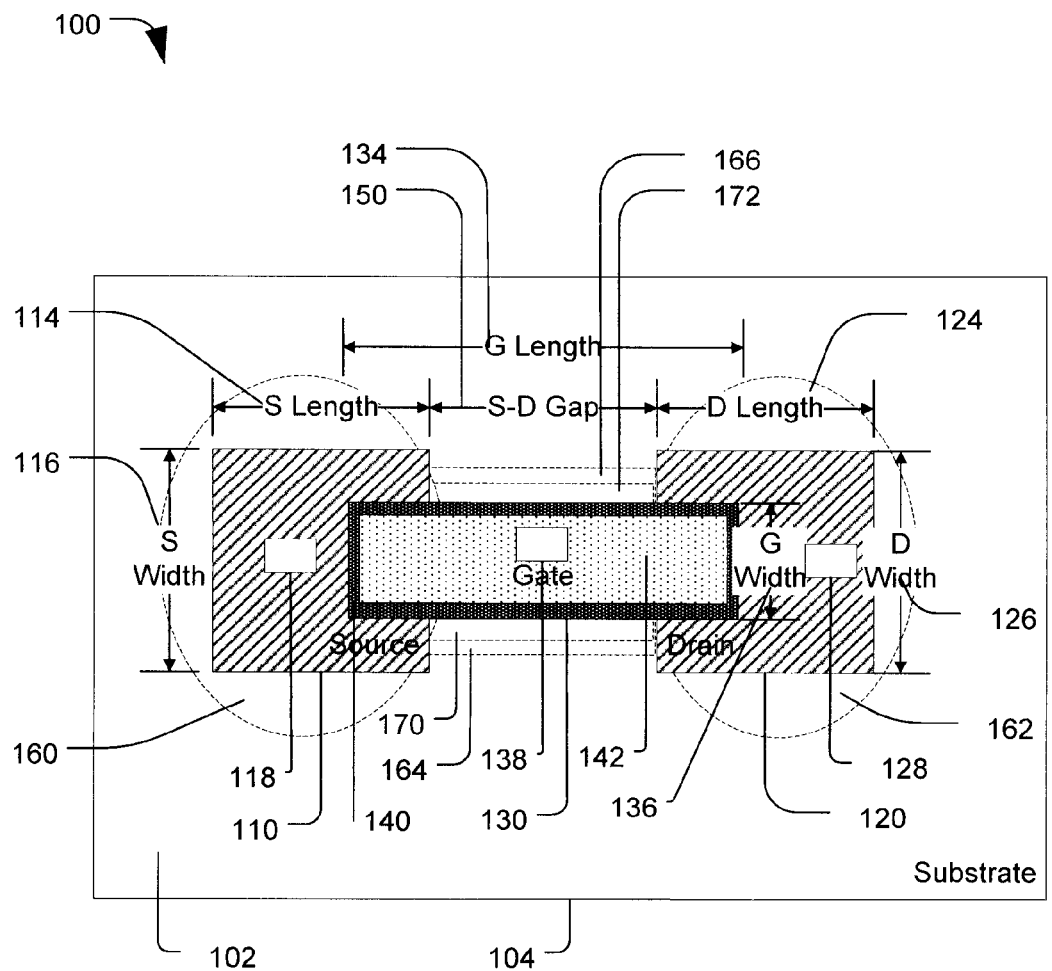

FIGS. 1a and 1b illustrate a cross-sectional side view and a top plan view, respectively, of a particular embodiment of a deep trench field effect transistor (FET) 100. The deep trench FET 100 includes a substrate 104, such as a negatively doped semiconductor material (N⁻ material), a source 110, a drain 120, and an embedded gate 130 extending from the source 110 to the drain 120. The N⁻ material may include negatively doped silicon. Each of the source 110, the drain 120, and the embedded gate 130 extend into a surface 102 of the substrate 104. Because the source 110, the drain 120, and the embedded gate 130 have geometries that extend deep into the substrate 104, but are narrow along the surface 102, the deep trench FET 100 may have a relatively large current carrying capacity and a relatively small surface area on the substrate 102.

The source 110 includes a positively doped semiconductor material (P⁺ material). The P⁺ material may include positively doped silicon. In a particular embodiment, the P⁺ material may include grown epitaxial layers doped to a doping concentration of at least approximately $1\times10^{19}$ atoms/cm³. In an embodiment, the P⁺ material may include layers grown via an epitaxial process. The source 110 has a source depth 112, a source length 114, and a source width 116. In a particular embodiment, the source depth 112 is at least ten times as large as the source length 114 and at least ten times as large as the source width 116. In another particular embodiment, the source depth 112 is approximately four microns. The source 110 may be coupled to a source conductor 118 that may be used to provide an electrical connection to the source 110.

The drain 120 includes a positively doped semiconductor material, such as the P⁺ material of the source 110. The drain 120 has a drain depth 122, a drain length 124, and a drain width 126. In a particular embodiment, the drain depth 122 may be at least ten times as large as the drain length 124 and at least ten times as large as the drain width 126. In another particular embodiment, the drain depth 122 is approximately four microns. The drain length 124 may be approximately equal to the source length 114, the drain width 126 may be approximately equal to the source width 116, and the drain depth 122 may be approximately equal to the source depth 112. The drain 120 may also be coupled to a drain conductor 128 that may be used to provide an electrical connection to the drain 120. A source-drain gap 150 (i.e. a distance between the source 110 and the drain 120) may be at least one-fourth as large as the source length 114.

The embedded gate 130 is formed of an insulating material 140 and a conductive material 142. The embedded gate 130 extends from the source 110 to the drain 120, and has a gate depth 132, a gate length 134, and a gate width 136. A first portion of the embedded gate 130 contacts the source 110 and a second portion of the embedded gate 130 contacts the drain 120. The insulating material 140 electrically isolates the conductive material 142 from each of the source 110, the drain 120, and the substrate 104. In an embodiment, the insulating material 140 includes an oxide of silicon (e.g. silicon dioxide) or another dielectric material. In an embodiment, the conductive material 142 includes a metal or polycrystalline silicon. In a particular embodiment, the gate depth 132 may be at least one-half of the source depth 112. For example, the gate depth 132 is approximately 3.5 microns. In an example, the gate width 136 may be approximately one-half as large as the source width 116. In another example, the gate length 136 is larger than the source-drain gap 150. The embedded gate 130 may also be coupled to a gate conductor 138 that may be used to provide an electrical connection to the embedded gate 130.

In operation, a voltage ($V_{DS}$) may be applied between the drain 120 and the source 110. Another voltage ($V_{GS}$) may be applied across the gate 130 and the source 110 to control whether the deep trench FET 100 is in an active state or an inactive state. When $V_{GS}$ is less than a threshold voltage ($V_{TH}$), the deep trench FET 100 is in the inactive state (i.e. in a sub-threshold mode of operation), and substantially no current flows between the drain 120 and the source 110. When $V_{GS}$ exceeds the threshold voltage ($V_{TH}$), inversion layers 170 and 172 form adjacent to the embedded gate 130 enabling current to flow between the drain 120 and the source 110.

The deep trench FET 100 may provide a high current carrying capacity and have a low leakage current relative to a footprint surface area (i.e. a size on the surface 102 of the substrate 104) of the deep trench FET 100. For a top-gated FET, a current capacity may be roughly proportional to a width of the gate. Therefore, the current capacity may be increased by increasing a width of the surface mounted gate, relating to an increase in a footprint surface area of the top-gated FET. In the deep trench FET 100, the embedded gate 130 extending below the surface 102 of the substrate 104 enables the inversion layers 170 and 172 to form on three sides of the embedded gate 130 (i.e. two vertical sides and a bottom side). Therefore, the current carrying capacity of the deep trench FET 100 may be increased by increasing the gate depth 132, instead of increasing the gate width 136. As an example, a footprint surface area of the deep trench FET 100 may be approximately five times smaller than a footprint surface area of the top-gated FET having a comparable current capacity.

The deep trench FET 100 may have large depletion regions 160 and 162 around the source 110 and the drain 120 and smaller depletion regions 164 and 166 along the embedded gate 130. The large depletion regions 160 and 162 surrounding the source 110 and the drain 120 may result in a low sub-threshold leakage current, and therefore lower power consumption, when the deep trench FET 100 is in an inactive state. The smaller depletion regions 164 and 166 along the embedded gate 130 may enable faster response in creation of the inversion channel 170 and 172 when $V_{GS}$ satisfies $V_{TH}$.

Although FIGS. 1a and 1b depict the deep trench FET 100 as a p-channel device that includes N⁻ material in the substrate 104 and P⁺ material in the source 110 and the drain 120, in another embodiment the deep trench FET 100 may be an n-channel device. For example, the substrate 104 may include positively doped semiconductor material, and the source 110 and the drain 120 may include negatively doped semiconductor material. In the n-channel device, the deep trench FET 100 would be in an inactive state (e.g. sub-threshold mode of operation) when $V_{GS}$ is greater than (i.e. less negative than) $V_{TH}$ and would transition to an active state when $V_{GS}$ is less than (i.e. more negative than) $V_{TH}$.

Figure 2:
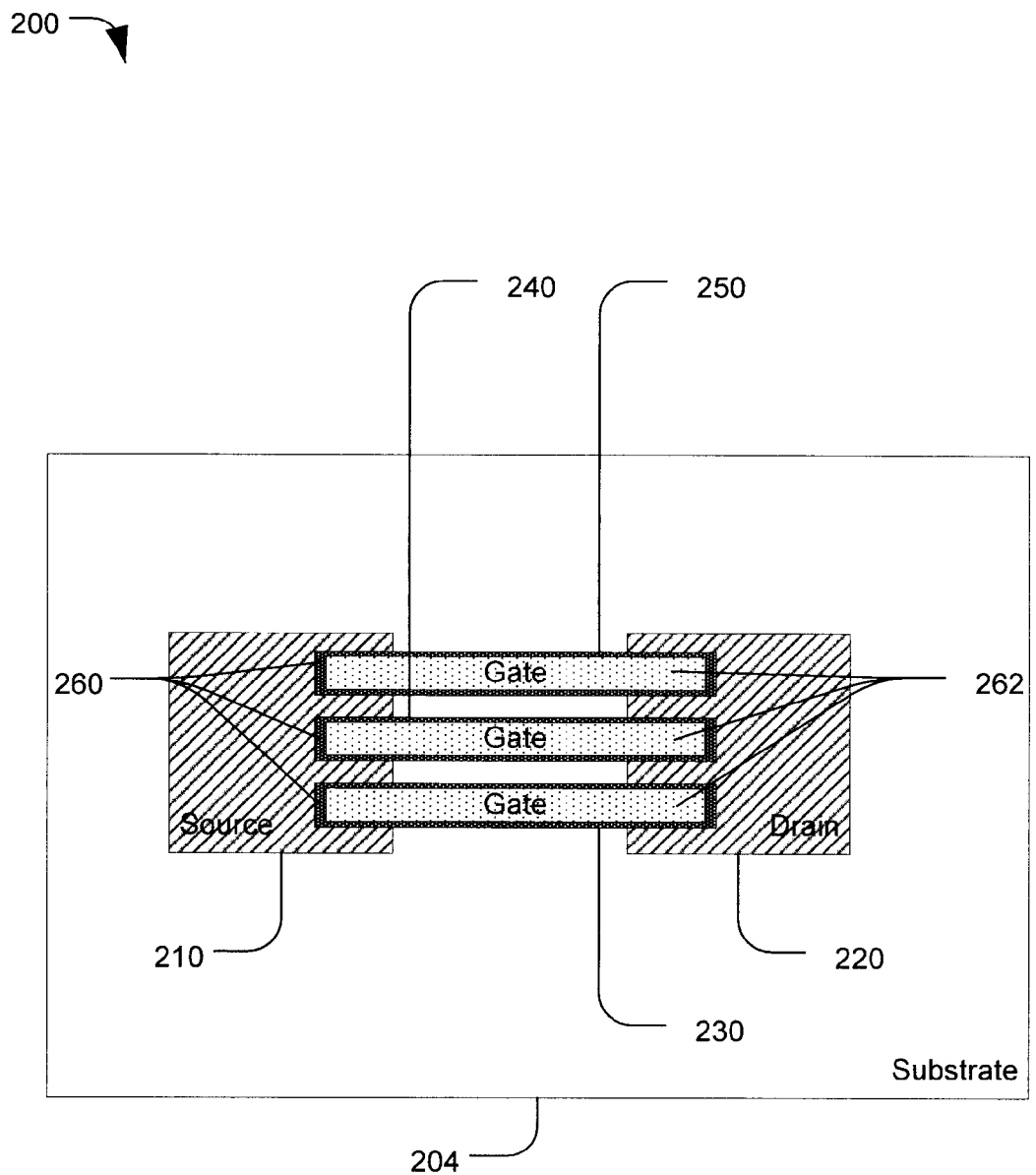
FIG. 2 is a top plan view of a second particular embodiment of a deep trench field effect transistor having multiple gates.

FIG. 2 is a top plan view depicting a second embodiment of a deep trench FET 200. The deep trench FET 200 has a source 210, a drain 220, and a first embedded gate 230, a second embedded gate 240, and a third embedded gate 250 (multiple gates 230, 240, and 250) in a substrate 204. The substrate 204 may correspond to the substrate 104 of FIGS. 1a and 1b, the source 210 may correspond to the source 110 of FIGS. 1a and 1b, and the drain 220 may correspond to the drain 120 of FIGS. 1a and 1b. The multiple gates 230, 240, and 250 provide increased current capacity due to the increased inversion layer surface area of the multiple gates 230, 240, and 250.

The multiple gates 230, 240, and 250 each extend into the substrate 204 and extend from the source 210 to the drain 220. A first portion of each of the multiple gates 230, 240, and 250 contacts the source 210 and a second portion of the each of the multiple gates 230, 240, and 250 contacts the drain 220. The multiple gates 230, 240, 250 may include an insulating material 260 and a conductive material 262. In each of the multiple gates 230, 240, and 250, the insulating material 260 electrically isolates the conductive material 262 from each of the source 210, the drain 220, and the substrate 204. In a particular illustrative embodiment, the insulating material 260 includes an oxide of silicon (e.g. silicon dioxide) or another dielectric material. In a particular illustrative embodiment, the conductive material 262 includes a metal or polycrystalline silicon. The multiple gates 230, 240, and 250 each have a respective gate depth, gate width, and gate length. In an embodiment, the gate depth of each of the multiple gates 230, 240, and 250 may be approximately equal. The gate depths of each of the multiple gates 230, 240, 250 may be at least one-half of a depth of the source 210. In a particular illustrative embodiment, each of the multiple gates 230, 240, and 250 has a gate depth of approximately 3.5 microns. Each of the multiple gates 230, 240, 250 may be coupled to a single, shared gate conductor that may be used to provide an electrical connection to the multiple gates 230, 240, and 250.

In operation, the deep trench FET 200 is similar to the deep trench FET 100 of FIGS. 1a and 1b. Each of the multiple gates 230, 240, 250 may form channels within inversion layers on both vertical sides of each of the multiple gates 230, 240, and 250. The channels in the inversion layers provide an electrical current path between the drain 220 and the source 210. Increasing a number of gates in the deep trench FET 200 may increase the total inversion layer surface area. The increase in inversion layer surface area may further increase a current carrying capacity of the deep trench FET 200 beyond a current carrying capacity of a top-gated FET having a comparable footprint surface area.

Although FIG. 2 depicts the deep trench FET 200 as a p-channel device that includes N⁻ material in the substrate 204 and P⁺ material in the source 210 and the drain 220, in another embodiment the deep trench FET 200 may be an n-channel device. Although FIG. 2 illustrates three gates, in other embodiments the deep trench FET 200 may have two gates or more than three gates.

Figure 3D:
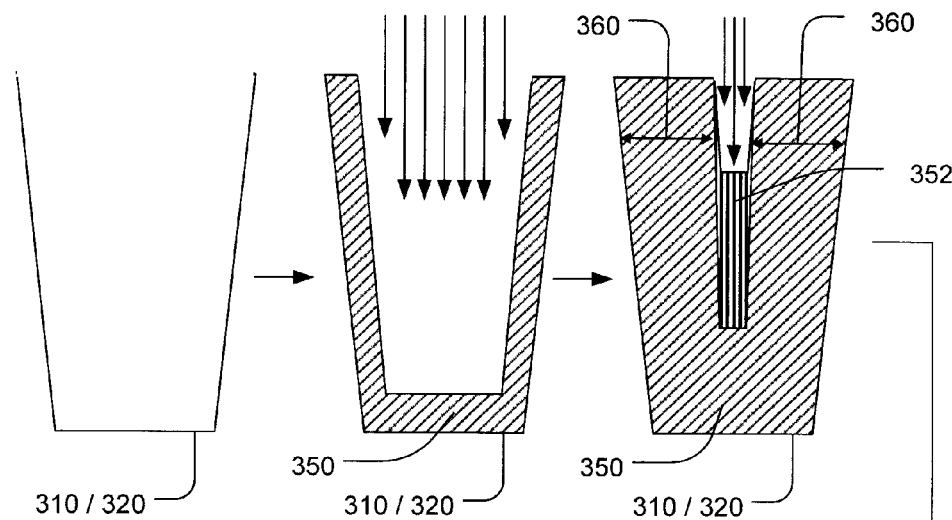
Figure 3D:
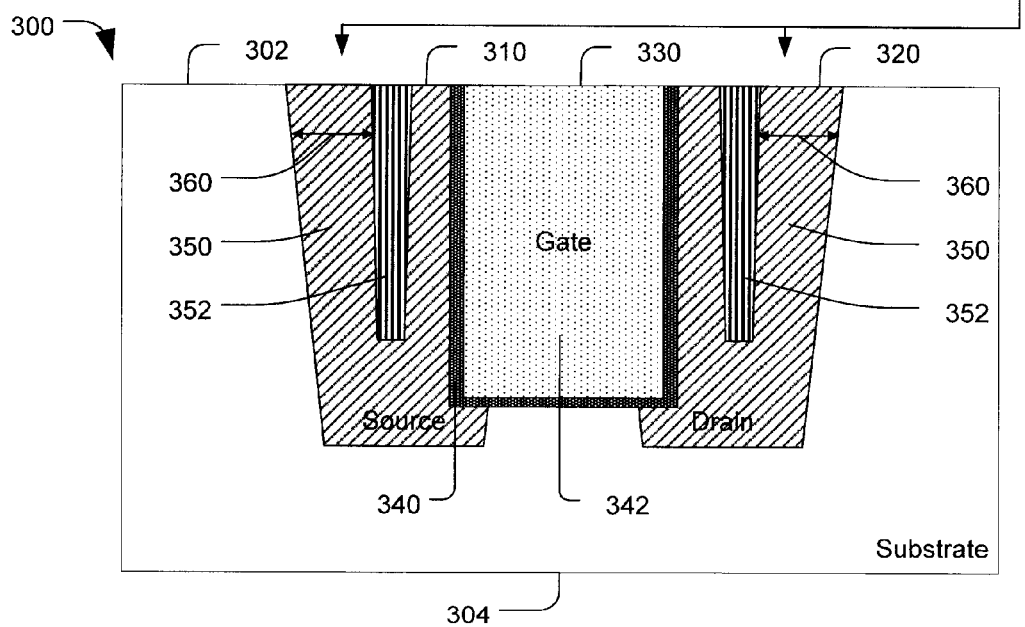

FIGS. 3a, 3b, 3c, and 3d depict various states of fabrication of a third embodiment of a deep trench FET 300. FIG. 3a depicts a source trench of the source 310 (or a drain trench of the drain 320) prior to growing epitaxial layers (as explained with respect to FIG. 4) of a positively doped semiconductor material (P⁺ material) 350.

FIG. 3b depicts the source 310 (or the drain 320) at an intermediate stage of growing the epitaxial layers of P⁺ material 350 along all sidewalls and the bottom of the source trench (or the drain trench). FIG. 3c depicts the source 310 (or the drain 320), after having achieved at least a first sidewall thickness 360 of the P+ material 350 along the sidewalls of the source trench (or the drain trench). A first conductive material 352 is deposited into a remaining portion of the source trench (or the drain trench). In an example, the first conductive material includes a metal or a polycrystalline silicon material. In a particular illustrative embodiment, the first sidewall thickness 360 may be at least 100 angstroms. In a particular illustrative embodiment, a doping concentration of the P+ material is at least approximately $1 \times 10^{19}$ atoms/cm$^3$.

FIG. 3d depicts the deep trench FET 300 including a substrate 304, the source 310, the drain 320, and an embedded gate 330 extending from the source 310 to the drain 320. The substrate 304 may correspond to the substrate 104 of FIGS. 1a and 1b. The embedded gate 330 may correspond to the embedded gate 130 of FIGS. 1a and 1b. An insulating material 340 and a second conductive material 342 included in the embedded gate 330 may correspond to the insulating material 140 and the conductive material 142, respectively, of FIGS. 1a and 1b, respectively. Including the first conductive material 352 at an inner portion of the source 310 and the drain 320 may result in reduced resistance in the deep trench FET 300 as compared to embodiments where the source and the drain do not include the conductive material 352. Lowering the resistance in the deep trench FET 300 may reduce heat generation and may also assist thermal transfer from the deep trench FET 300.

Operation of the deep trench FET 300 may be similar to the deep trench FET 100 of FIGS. 1a and 1b. However, performance and current capacity of a FET may be affected by temperature. When the deep trench FET 300 is in an active state, current flowing between the drain 310 and the source 320 may generate heat due to resistance in the deep trench FET 300. A reduction in operating temperature of the deep trench FET 300 may result in improved performance and an increased current carrying capacity of the deep trench FET 300. The inclusion of the first conductive material 352 in at least one of the source 310 and the drain 320 may result in lower resistance within the deep trench FET 300. The lower resistance may result in reduced heat generation and may provide increased thermal conduction of the deep trench FET 300.

Although FIGS. 3a-d depict the deep trench FET 300 as a p-channel device that includes N− material in the substrate 304 and P+ material in the source 310 and the drain 320, in another embodiment the deep trench FET 300 may be an n-channel device.

FIG. 4 depicts a first particular embodiment of a method 400 of fabricating a deep trench FET, such as the deep trench FET 100 of FIGS. 1a and 1b. The method 400 includes, at 402, forming a source trench and a drain trench in a surface of a substrate, such as the substrate 104 of FIGS. 1a and 1b. The substrate may include a first semiconductor material, such as a lightly doped silicon material having a first conductivity type. A source depth of the source trench and a drain depth of the drain trench may be approximately equal, such as the source depth 112 and the drain depth 122 of FIGS. 1a and 1b. The source trench and the drain trench may be formed via an etching process to remove layers from the surface of the substrate.

A source and a drain, such as the source 110 and the drain 120 of FIGS. 1a and 1b, are formed by depositing a second semiconductor material into the source trench and the drain trench at 408. The second semiconductor material may include a doped silicon material having a second conductivity type that is distinct from the first conductivity type. The source trench and the drain trench may be at least partially filled by growing epitaxial layers of the second semiconductor material along sidewalls and a bottom of the source trench and the drain trench. In an embodiment, a doping concentration of the second semiconductor material may be at least approximately $1 \times 10^{19}$ atoms/cm$^3$.

A gate trench is formed in the substrate to a gate depth at 410. The gate depth, such as the gate depth 132 of FIGS. 1a and 1b, may be at least one-half of the source depth. The gate trench may extend from the source to the drain, and a first portion of the gate trench may extend into the second semiconductor material of the source and a second portion of the gate trench may extend into the second semiconductor material of the drain. The gate trench may be formed via an etching process.

The method 400 further includes forming an embedded gate, such as the embedded gate 130 of FIGS. 1a and 1b. The gate may be formed by depositing an insulating material (e.g. the insulating material 140 of FIGS. 1a and 1b) into the gate trench, at 412, and depositing a conductive material (e.g. the conductive material 142 of FIGS. 1a and 1b) into the gate trench, at 414. The insulating material may be in contact with the first semiconductor material of the substrate and in contact with the second semiconductor material of the source and the drain to electrically isolate the gate from the source, the drain, and the substrate. The insulating material may include a material such as an oxide of silicon (e.g. silicon dioxide) or another dielectric material. The first conductive material may include a metal or a polycrystalline silicon material.

After depositing the second semiconductor material into the source trench, a source conductor may be attached to the source, such as the source conductor 118 of FIGS. 1a and 1b. After depositing the second semiconductor material into the drain trench, a drain conductor may be attached to the drain trench, such as the drain conductor 128 of FIGS. 1a and 1b. A gate conductor may be attached to the first conductive material in the gate trench, such as the gate conductor 138 of FIGS. 1a and 1b, at 416.

The method 400 enables formation of a deep trench FET that may provide a high current carrying capacity and have a low leakage current relative to a size of the deep trench FET on the surface of the substrate. In the deep trench FET, the embedded gate extending below the surface of the substrate enables inversion layers to form on three sides of the embedded gate. Therefore, the current carrying capacity of the deep trench FET may be increased by increasing the gate depth, rather than increasing the gate width. The deep trench FET may have large depletion regions around the source and the drain and smaller depletion regions along the embedded gate. The large depletion regions surrounding the source and the drain may result in a low sub-threshold leakage current, and therefore lower power consumption, when the deep trench FET is in an inactive state. The smaller depletion regions along the embedded gate may enable faster response in creation of the inversion channel when transitioning to an active state.

FIG. 5 depicts a second particular embodiment of a method 500 of fabricating a deep trench FET having a higher doping concentration in a source and a drain, such as the deep trench FET 100 of FIGS. 1a and 1b. The method 500 includes, at 502, forming a source trench and a drain trench in a surface of a substrate, such as the substrate 104 of FIGS. 1a and 1b. The substrate may include a first semiconductor material, such as a lightly doped silicon material having a first conductivity type. A source depth of the source trench and a drain depth of the drain trench may be approximately equal, such as the source depth 112 and the drain depth 122 of FIGS. 1a and 1b.

The source trench and the drain trench may be formed via an etching process to remove layers from the surface of the substrate.

A source and a drain, such as the source 110 and the drain 120 of FIGS. 1a and 1b, are formed by depositing a second semiconductor material into the source trench and the drain trench by growing epitaxial layers of the second semiconductor material along all sidewalls and the bottom of the source trench and drain trench, at 506, stopping the growth of the epitaxial layers in response to achieving a first wall thickness of the second semiconductor material along all sidewalls of the source trench and the drain trench, at 508, doping the grown epitaxial layers of the second semiconductor material in the source trench and the drain trench, at 510, and after doping the second semiconductor material, resuming depositing of the second semiconductor material into the source trench and the drain trench, at 512. The second semiconductor material may include a doped silicon material having a second conductivity type that is distinct from the first conductivity type. The source trench and the drain trench may be at least partially filled by growing epitaxial layers of the second semiconductor material along sidewalls and a bottom of the source trench and the drain trench. In an embodiment, the first wall thickness is approximately 100 angstroms. In an embodiment, doping of the second semiconductor material includes a solid source doping process. In an embodiment, a doping concentration of the second semiconductor material after doping to a higher concentration may be at least approximately $1\times10^{22}$ atoms/cm$^3$.

A gate trench is formed in the substrate to a gate depth, at 514. The gate depth, such as the gate depth 132 of FIGS. 1a and 1b, may be at least one-half of the source depth. The gate trench may extend from the source to the drain, and a first portion of the gate trench may extend into the second semiconductor material of the source and a second portion of the gate trench may extend into the second semiconductor material of the drain. The gate trench may be formed via an etching process.

The method 500 further includes forming an embedded gate, such as the embedded gate 130 of FIGS. 1a and 1b. The gate may be formed by depositing an insulating material (e.g. the insulating material 140 of FIGS. 1a and 1b) into the gate trench, at 516, and depositing a conductive material (e.g. the conductive material 142 of FIGS. 1a and 1b) into the gate trench, at 518. The insulating material may be in contact with the first semiconductor material of the substrate and with the second semiconductor material of the source and the drain to electrically isolate the gate from the source, the drain, and the substrate. The insulating material may include a material such as an oxide of silicon (e.g. silicon dioxide) or another dielectric material. For example, the first conductive material may include a metal or a polycrystalline silicon material.

After depositing the second semiconductor material into the source trench, a source conductor may be attached to the source, such as the source conductor 118 of FIGS. 1a and 1b. After depositing the second semiconductor material into the drain trench, a drain conductor may be attached to the drain trench, such as the drain conductor 128 of FIGS. 1a and 1b. A gate conductor may be attached to the first conductive material in the gate trench, such as the gate conductor 138 of FIGS. 1a and 1b, at 520.

The method 500 enables formation of a deep trench FET that may provide a high current carrying capacity and a low leakage current relative to a size of the deep trench FET on the surface of the substrate having the characteristics described for the deep trench FET produced using the method 400. The method 500 may reduce source and drain resistance by doping the second semiconductor material to a higher doping concentration. The lower resistance may reduce an operating temperature of the deep trench FET. The lower operating temperature of the deep trench FET may result in better performance and an increased current carrying capacity.

FIG. 6 depicts a third particular embodiment of a method 600 of fabricating a deep trench FET having a conductive material in a source and a drain, such as the deep trench FET 300 of FIGS. 3a-d. The method 600 includes, at 602, forming a source trench and a drain trench in a surface of a substrate, such as the substrate 304 of FIGS. 3a-d. The substrate may include a first semiconductor material, such as a lightly doped silicon material having a first conductivity type. A source depth of the source trench and a drain depth of the drain trench may be approximately equal. The source trench and the drain trench may be formed via an etching process to remove layers from the surface of the substrate.

A source and a drain, such as the source 310 and the drain 320 of FIGS. 3a-d, are formed by at least partially filling the source trench and the drain trench by growing epitaxial layers of a second semiconductor material, at 608, stopping the growth of the epitaxial layers in response to achieving a first wall thickness of the second semiconductor material along all sidewalls of the source trench and the drain trench, and depositing a first conductive material into the source trench and the drain trench, such as the first conductive material 352 in FIGS. 3c and 3d, at 610. The second semiconductor material may include a doped silicon material having a second conductivity type that is distinct from the first conductivity type. The source trench and the drain trench may be at least partially filled by growing epitaxial layers of the second semiconductor material along sidewalls and a bottom of the source trench and the drain trench. In an embodiment the first wall thickness is approximately 100 angstroms. In an embodiment the first conductive material may include a metal or polycrystalline silicon material. In an embodiment, a doping concentration of the second semiconductor material may be at least approximately $1\times10^{19}$ atoms/cm$^3$.

A gate trench is formed in the substrate to a gate depth, at 612. The gate depth may be at least one-half of the source depth. The gate trench may extend from the source to the drain, and a first portion of the gate trench may extend into the second semiconductor material of the source and a second portion of the gate trench may extend into the second semiconductor material of the drain. The gate trench may be formed via an etching process.

The method 600 further includes forming an embedded gate, such as the embedded gate 330 of FIGS. 3a-d. The gate may be formed by depositing an insulating material (e.g. the insulating material 340 of FIGS. 1a and 1b) into the gate trench, at 614, and depositing a second conductive material (e.g. the conductive material 342 of FIGS. 3a-d) into the gate trench, at 616. The insulating material may be in contact with the first semiconductor material of the substrate and with the second semiconductor material of the source and the drain to electrically isolate the gate from each of the source, the drain, and the substrate. The insulating material may include a material such as an oxide of silicon (e.g. silicon dioxide) or another dielectric material. For example, the second conductive material may include a metal or a polycrystalline silicon material.

After depositing the second semiconductor material into the source trench, a source conductor may be attached to the source, such as the source conductor 118 of FIGS. 1a and 1b. After depositing the second semiconductor material into the drain trench, a drain conductor may be attached to the drain trench, such as the drain conductor 128 of FIGS. 1a and 1b. A gate conductor may be attached to the first conductive material in the gate trench, such as the gate conductor 138 of FIGS. 1a and 1b, at 618.

The method 600 enables formation of a deep trench FET that may provide a high current carrying capacity and a low leakage current relative to a size of the deep trench FET on the surface of the substrate having the characteristics described for the deep trench FET produced using method 400. The method 600 may reduce source and drain resistance and increase thermal conduction by including the conductive material in the source and the drain of the deep trench FET 300. The lower resistance and increased thermal conduction may reduce an operating temperature of the deep trench FET. The lower operating temperature of the deep trench FET may result in better performance and an increased current carrying capacity.

FIG. 7 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of the design structures and/or devices described above and shown in FIGS. 1a, 1b, 2, and 3a-d. The design structures processed and/or generated by design flow 700 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (BCAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 1a, 1b, 2, and 3a-d. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 1a, 1b, 2, and 3a-d to generate a Netlist 780 which may contain design structures such as design structure 720. The Netlist 780 may comprise, for example, compiled or otherwise processed data structures representing a list of wires, discrete components, logic gates, control circuits, I/O devices, models, etc. that describes the connections to other elements and circuits in an integrated circuit design. The Netlist 780 may be synthesized using an iterative process in which the Netlist 780 is resynthesized one or more times depending on design specifications and parameters for the device. As with other design structure types described herein, the Netlist 780 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including the Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments shown in FIGS. 1a, 1b, 2, and 3a-d. In one embodiment, design structure 790 may comprise a compiled, executable HDL simulation model that functionally simulates the devices shown in FIGS. 1a, 1b, 2, and 3a-d.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1a, 1b, 2, and 3a-d. Design structure 790 may then proceed to a stage 795 where, for example, design structure 790: proceeds to tape-out, is released to manufacturing, is released to a mask house, is sent to another design house, is sent back to the customer, etc.

While the invention has been described with reference to an exemplary embodiment, it should be understood by those skilled in the art that various changes may be made and equivalents may be substituted for elements thereof without departing from the scope of the invention. In addition, many modifications may be made to adapt a particular situation or substance to the teachings of the invention without departing from the scope thereof. Therefore, it is important that the invention not be limited to the particular embodiments disclosed, but that the invention will include all embodiments falling within the scope of the apportioned claims. Moreover, unless specifically stated any use of the terms first, second, etc. do not denote any order or importance, but rather the terms first, second, etc. are used to distinguish one element from another.

What is claimed is:

1. A method of fabricating a field effect transistor, the method comprising:
   forming a source trench and a drain trench in a substrate, wherein the substrate comprises a first semiconductor material, wherein a source depth of the source trench is approximately equal to a drain depth of the drain trench;
   forming a source and a drain by depositing a second semiconductor material into the source trench and into the drain trench;
   forming a gate trench in the substrate, wherein the gate trench is formed to a gate depth and extends from the source to the drain; and
   forming a gate by:
      depositing an insulating material into the gate trench, wherein the insulating material is in contact with the second semiconductor material in the source trench and the drain trench; and
      after depositing the insulating material into the gate trench, depositing a first conductive material into the gate trench.

2. The method of claim 1, wherein the gate depth is at least approximately one-half of the source depth.

3. The method of claim 1, wherein the gate depth is approximately 3.5 microns, wherein the source depth is approximately four microns, and wherein the drain depth is approximately four microns.

4. The method of claim 1, wherein depositing the second semiconductor material into the source trench and the drain trench comprises growing epitaxial layers of the second semiconductor material along all sidewalls and a bottom of the source trench and of the drain trench.

5. The method of claim 4, further comprising stopping the growth of the epitaxial layers in response to the second semiconductor material achieving at least a first sidewall thickness along all sidewalls of source trench and the drain trench.

6. The method of claim 5, further comprising:
   doping the grown epitaxial layers of the second semiconductor material in the source trench and in the drain trench; and
   after doping the grown epitaxial layers, resuming depositing of the second semiconductor material into the source trench and the drain trench.

7. The method of claim 5, further comprising, after stopping the growth of the epitaxial layers of the second semiconductor material in the source trench and the drain trench, depositing a second conductive material into the source trench and drain trench.

8. The method of claim 5, wherein the first sidewall thickness is approximately 100 angstroms.

9. The method of claim 1, further comprising:
   after forming the source and the drain, attaching a source conductor to the source and attaching a drain conductor to the drain; and
   attaching a gate conductor to the first conductive material in the gate trench.

10. A semiconductor device comprising:
    a source extending into a surface of a substrate;
    a drain extending into the surface of the substrate;
    a first embedded gate in the substrate extending from the source to the drain; and
    a second embedded gate in the substrate extending from the source to the drain.

11. The semiconductor device of claim 10, wherein the source comprises a second conductive material and wherein the drain comprises the conductive material.

12. The semiconductor device of claim 10, wherein a gate length of the gate is greater than a source-drain gap, wherein the source-drain gap is a distance between the source and the drain, and wherein a gate width of the gate is approximately one-half of a source width of the source.

13. The semiconductor device of claim 10, wherein the source includes a semiconductor material, wherein the drain includes the semiconductor material, and wherein a doping concentration of the semiconductor material is at least approximately $1\times10^{19}$ atoms/cm$^3$.

14. The semiconductor device of claim 10, wherein a gate depth of the first embedded gate is at least one-half a source depth of the source.

15. The semiconductor device of claim 14, wherein the gate depth is approximately 3.5 microns, wherein the source depth is approximately four microns, and wherein a drain depth of the drain is approximately four microns.

16. A semiconductor device comprising:
    a source having a source length along a surface of a substrate and a source depth into the substrate, the substrate comprising a first semiconductor material, wherein the source depth is at least ten times greater than the source length, the source comprising a second semiconductor material;

a drain having a drain length along the surface of the substrate and a drain depth into the substrate, wherein the drain depth is at least ten times greater than the drain length, the drain comprising the second semiconductor material; and a gate having a gate length along the surface of the substrate and a gate depth into the substrate, wherein the gate extends from the source to the drain, the gate comprising an insulating material and a conductive material, wherein the gate length is greater than a source-drain gap, and wherein the source-drain gap is a distance between the source and the drain.

17. The semiconductor device of claim 16, wherein the gate depth is at least one-half of the source depth.

18. The semiconductor device of claim 16, wherein the source-drain gap is at least one-fourth of the source length, and wherein the source-drain gap is a smallest distance between the source and the drain.

19. The semiconductor device of claim 16, wherein a first portion of the gate contacts the source and a second portion of the gate contacts the drain.

20. The semiconductor device of claim 16, wherein the source further comprises a conductive material and wherein the drain further comprises the conductive material.

* * * * *